United States Patent
Feldhofer et al.

(10) Patent No.: US 9,454,471 B2
(45) Date of Patent: Sep. 27, 2016

(54) ELECTRONIC COUNTER IN NON-VOLATILE LIMITED ENDURANCE MEMORY

(71) Applicant: NXP B.V., Eindhoven (NL)

(72) Inventors: Martin Feldhofer, Weiz (AT); Franz Amtmann, Graz (AT); Soenke Ostertun, Wedel (DE); Alicia da Conceicao, San Jose, CA (US)

(73) Assignee: NXP B.V., Eindhoven (NL)

( * ) Notice: Subject to any disclaimer, the term of this patent is extended or adjusted under 35 U.S.C. 154(b) by 162 days.

(21) Appl. No.: 14/029,659

(22) Filed: Sep. 17, 2013

(65) Prior Publication Data

US 2014/0089612 A1   Mar. 27, 2014

(30) Foreign Application Priority Data

Sep. 27, 2012 (EP) .................... 12186356

(51) Int. Cl.
  *G06F 12/00*  (2006.01)
  *H03K 21/40*  (2006.01)

(52) U.S. Cl.
  CPC ............ *G06F 12/00* (2013.01); *H03K 21/403* (2013.01)

(58) Field of Classification Search
  None
  See application file for complete search history.

(56) References Cited

U.S. PATENT DOCUMENTS

| | | | |
|---|---|---|---|
| 5,181,231 A | 1/1993 | Parikh et al. | |
| 5,231,592 A | 7/1993 | Itoh | |
| 5,450,460 A * | 9/1995 | Stodieck | 377/44 |
| 6,003,768 A * | 12/1999 | Shona | 235/380 |
| 7,526,059 B1 * | 4/2009 | Shen et al. | 377/34 |
| 2006/0133560 A1 | 6/2006 | Takagi | |
| 2010/0318786 A1 | 12/2010 | Douceur et al. | |

FOREIGN PATENT DOCUMENTS

CN    1782924 A    6/2006

OTHER PUBLICATIONS

Extended European Search Report for Patent Appln. No. 12186356.7 (Mar. 7, 2013).

* cited by examiner

*Primary Examiner* — Daniel Tsui

(57) ABSTRACT

An electronic counter is provided having a sequence of memory cells and increment logic. Each memory cell of the sequence is non-volatile and supports a one state and a zero state. The one state can also be referred to as a 'programmed state', the zero state as an 'erased state'. The counter is configured to represent at least part of a current counting-state of the counter as a pattern of one and zero states in the memory cells of the sequence of memory cells, and increment logic configured to advance the pattern of one and zero states to a next pattern to represent an increment of the counter.

18 Claims, 5 Drawing Sheets

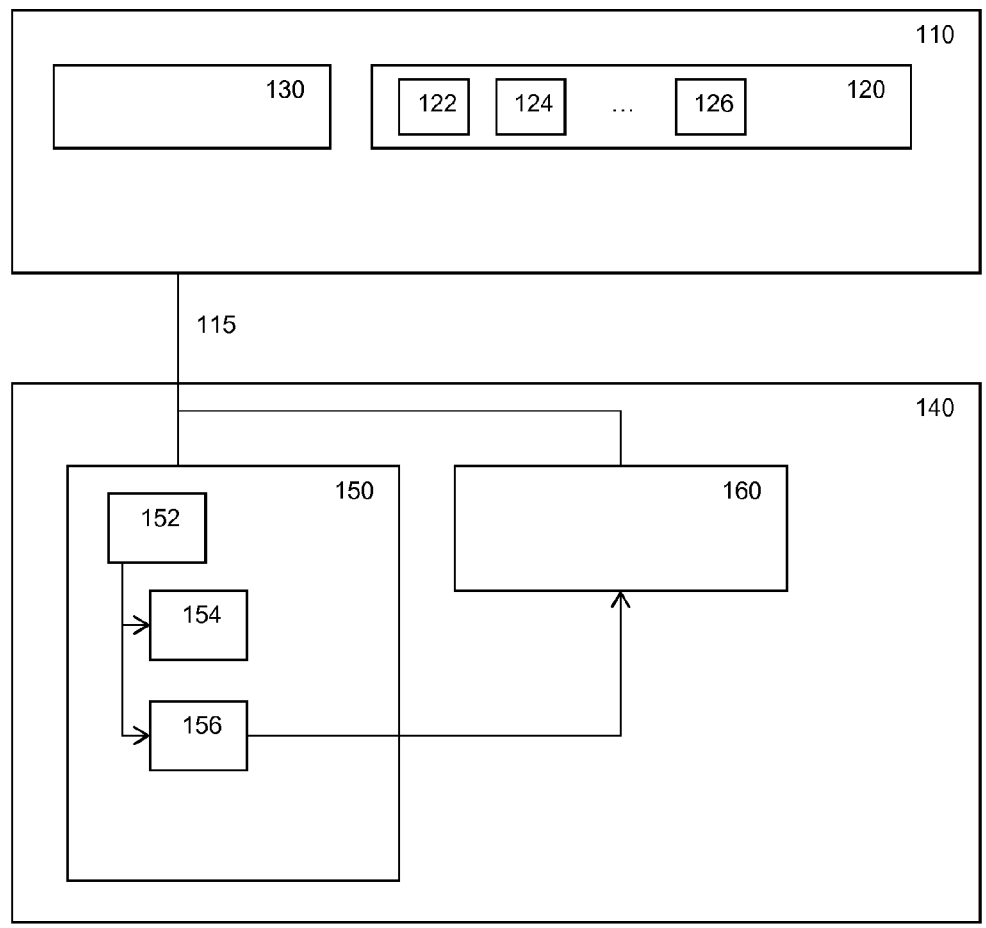
Figure 1                                                                 100
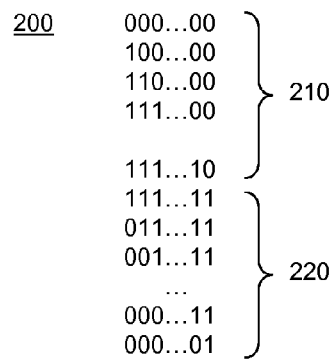
Figure 2

ELECTRONIC COUNTER IN NON-VOLATILE LIMITED ENDURANCE MEMORY

CROSS-REFERENCE TO RELATED APPLICATIONS

This application claims the priority under 35 U.S.C. §119 of European patent application no. 12186356.7, filed on Sep. 27, 2012, the contents of which are incorporated by reference herein.

FIELD OF THE INVENTION

The invention relates to an electronic counter comprising a sequence of memory cells, each memory cell being non-volatile and supporting a one state and a zero state, the counter being configured to represent at least part of a current counting-state of the counter as a pattern of one and zero states in the memory cells of the sequence of memory cells, and increment logic configured to advance the pattern of one and zero states to a next pattern to represent an increment of the counter.

BACKGROUND OF THE INVENTION

There are many applications wherein an electronic device needs a non-volatile non-decreasing counter. For example, such a counter may be needed to keep track of the amount of usage of the device. For example, for warranty reasons one may want to keep track of how often the device was powered-up. Another reason for having a non-volatile non-decreasing counter is for security purposes. For example, patent application US 2010/0318786, with title 'Trusted Hardware Component for Distributed Systems', included by reference, discloses a trusted hardware component comprising a monotonically non-decreasing counter. Other applications of non-decreasing counters include avoiding roll-back attacks in which an attacker attempts to roll-back the entire device to a previous state, for example, to prolong access to content under a digital right.

One particular aspect of implementing counters in non-volatile memory, in particular EEPROM memory, is that the memory may have restrictions on the number of program-erase cycles it supports.

A typical realization of a counter that stores its value in a non-volatile memory would be a binary counter. A binary counter has the advantage of needing the least number of bits to support a particular counting range. Counting up to $2^n-1$ needs only n bits of memory cells. On the other hand, using the binary representation, the least significant bit toggles on every increment of the counter. This leads to a very high number of cycles in the least-significant bits in the EEPROM which could exceed the endurance of the EEPROM. (The endurance is the number of cycles an EEPROM memory cell can be programmed and then erased until end of life time of the cell). Malfunctioning devices are likely, especially for larger values of n.

A little better approach than a binary counter value would be to use a Gray code where the bit coding is done so that from one counter state to the next only one bit changes (not always the least significant bit). This would distribute the number of cycles a little bit better but in total the number of cycles compared to the number of memory cells used remains very high. Even if so-called balanced gray codes are used, in which bit changes are distributed uniformly over the bits, the number of bit changes will eventually exceed endurance for larger values of n.

Very complicated methods are used for wear-leveling in complex systems like flash memories. These methods require very high effort on encoding and are only useful for complex file systems. The basic concept there is that "damaged" memory cells are relocated to other memory areas.

U.S. Pat. No. 5,231,592 discloses a known counter implemented on electrically erasable and programmable read-only memory (EEPROM). The EEPROM, which has an endurance of 'V', i.e., each cell is designed to be erased and programmed at most V times. The EEPROM is divided into N count areas which store count values in binary representation, each count are capable of storing count values from zero to V, and a number area for storing a number in binary representation identifying the count area currently in use. The count areas are used in succession to store counts up to N times V, with a maximum of $V^2$.

SUMMARY OF THE INVENTION

Although the known counter enables counting beyond the endurance without stressing individual cells more than its endurance, it has several disadvantages. For example, a counter according to this design cannot exceed the limit of $V^2$. Moreover, the counter needs a large number of bits to achieve this.

For at least these reasons it would be advantageous to have an improved counter.

An electronic counter is provided comprising a sequence of memory cells and increment logic. Each memory cell of the sequence is non-volatile and supports a one state and a zero state. The one state can also be referred to as a 'programmed state', the zero state as an 'erased state'. The counter is configured to represent at least part of a current counting-state of the counter as a pattern of one and zero states in the memory cells of the sequence of memory cells. For example, the counter may employ further memory, including possible, further sequences, to represent the counting state.

The increment logic is configured to advance the pattern of one and zero states to a next pattern to represent an increment of the counter. The increment logic comprises programming increment logic and erasing increment logic, the increment logic being configured to alternate between a programming phase in which the programming increment logic advances the pattern, and an erasing phase in which the erasing increment logic advances the pattern. The programming increment logic is configured to program a next cell of the sequence of non-volatile memory cells from a zero state to a one state. The program phase terminates when all memory cells of the sequence of memory cells are in the one state. The erasing increment logic is configured to erase a next cell of the sequence of non-volatile memory cells from a one state to a zero state. The erase phase terminates when all memory cells of the sequence of memory cells are in the zero state.

Counting operations for the part of the counting-state represented in the sequence of memory cells require a very low number of programming and erase operations to cycle through an entire cycle of counting. During the programming phase each cell is programmed only once, and during the erase phase each cell is erased only once. Denoting the number of memory cells in the sequence with 'n', the counter can represent 2n different patterns, i.e., count from 0 to (2n−1). An entire cycle of counting starting until the counter overflows, i.e., a pattern repeats, needs only one endurance cycle per cell; An endurance cycle being one program and one erase operation. Furthermore the largest value the counter can attain is only limited by the number of cells assigned to, not by the maximum endurance of a cell.

One cell in the sequence of memory cells is denoted as the final memory cell. One cell in the sequence of memory cells is denoted as the first cell. Each memory cell except the final cell has one next cell. The sequence may be implemented as one or more, or parts thereof, of memory words. The sequence may be implemented as an array data structure.

If the memory cells have a limited endurance, denoted by 'v', each cell can be programmed v times and erased v times. Using such cells, the counter can count v times from 0 to 2n−1. This counter is thus reusable.

The electronic counter is particularly suitable for counters implemented in EEPROM memory. In an embodiment, the memory cells in the sequence of memory cells are EEPROM memory cells. Some types of EEPROM memory cell have a limited endurance, typically of 100000 (100 k). We will use 100000 as an example value for the endurance. The counter design is also applicable to memories having higher or lower endurance.

In an embodiment, the counter comprises a non-volatile high-word memory and a high-word increment logic. The high-word memory is used to store a different part of the counting state of the counter. However, this part of the counting-state is encoded as a binary number using a base-2 positional number system. Typically, the bits in the high-word memory are ordered from a least significant bit to a most significant bit. Preferably, the high-word memory is implemented in the same physical memory as the sequence of memory cells, though at different positions.

The high-word increment logic is configured to increment the base-2 number represented in the high-word memory. The part of the counting state represented in the sequence of memory cells may also be referred to as the low-word. During typical operation the counter increments, by incrementing the low-word. When the low-word over-flows, the low-word counter is started again, e.g., resets, and the high-word is increased.

The end of one of the program and erase phase is chosen to trigger the increment in the high-word. For example, the high-word increments the high-word upon the program phase terminating, or the erasing phase terminating. The counter is configured to increment the-high word upon a particular one of the programming and erasing phase terminating.

The high-word counter is very efficient, in the sense that it needs little memory to encode a high number of different patterns. However, since binary counting is used, any increment potentially changes multiple cells through overflow. In an embodiment, the number of memory cells used for counting in the further memory is ceil (log(v)/log(2)). Actually, since upon each increment a cell is either programmed or erased but not both, one count up to 2v without violating endurance requirements; this means that one may add 1 memory to the above formula.

The endurance of the high-word counter may be somewhat improved by employing a Gray encoding. The changing cells are spread better over the memory. Among different choices for Gray encodings a so-called balanced Gray encoding is a good choice to achieve this. However, it is noted that using a Gray encoding is not necessary. Using a more conventional base-2 positional number system, considerably simplifies the design.

The combination of a high-word counter with low-endurance, i.e., which cannot be reused often, but high memory size efficiency, with a low-word counter which has a high endurance but low memory size efficiency, is surprisingly effective. By increasing the number of memory cells in the sequence of memory cells, the counter may be configured to count until any desired maximum.

The increment logic may be configured to determine a current phase for the sequence of memory cells from the state of a final memory cell in the sequence of memory cells. The current phase is the programming phase if the final memory cell is in a zero state. The current phase is the erasing phase if the final memory cell is in a one state.

In an embodiment, the counter comprises multiple low counters. The counter may comprises multiple sequences of memory cells, each memory cell of the multiple sequences being non-volatile and supporting a one state and a zero state, the counter being configured to represent multiple sub-states of the current counting-state of the counter as a pattern of one and zero states in the memory cells of the multiple sequences of memory cells, all-but-one of the multiple sequences are configured with a pattern indicating that the sequence is inactive, one of the multiple sequences is configured with a different pattern than the pattern indicating that the sequence is inactive, the pattern being all one states or all zero states. The increment logic is configured to determine an active sequence of the multiple sequences not storing the inactive pattern, and configured to advance the active sequence to a next pattern, upon the next pattern reaching the inactive pattern, the increment logic further advances a next sequence of the multiple sequences.

Organizing the memory cells into multiple sequences instead of in a single sequence has many advantages. Multiple sequences significantly expand the freedom for the implementer to optimize his design. For example, multiple sequences may be used, with particular effect, to implement a counter on a memory which cannot be altered bit-individually. An EEPROM memory is typically organized in words (e.g. in 16-bit words); Erase works on words only, i.e. on groups of bits, of say 16 bits. Programming single bits can cause a significant disturb requiring erase operations before all single bits of such a group are set. Multiple final memory cells, or even all of the final memory cells, of the multiple sequences, may be stored in the same memory word. Thus the location of the sequence of the multiple sequences in which the transition to be updated is located may be obtained fast, with relatively little memory access.

In an embodiment the multiple sequences of memory cells are stored in multiple memory words of a writable non-volatile memory, each memory word comprising multiple bits, each bit of the multiple bits of a memory word implementing a memory cell of a different sequence of the multiple sequences. Although not necessary, the number of changes in active sequence may be reduced if the number of bits in a memory word equals the number of sequences in the multiple sequences. This embodiment is particularly advantageous if said memory supports program and erase operations on the memory word level. The number of bits in a word is the same for all words; for many memories the number equals 8, 16, 32 or 64.

Determining if a sequence is active may be done also by the increment logic. For example, the increment logic may be configured to determine a current phase for a sequence of memory cells of the multiple sequences from the state of the first memory cell and the final memory cell. For this reason is also beneficial to place multiple or all of the first cells in the same memory word.

In an embodiment, the counter comprises a further non-volatile high-word memory, wherein the high-word increment logic is configured to determine which memory of the high-word memory and the further high-word memory stores the higher number, and which stores the lower number, incrementing the higher number, writing the incremented higher number to the memory that stores the lower number. In this way there is always a valid high-word even if power to the counter was lost during writing, i.e., this increased tearing-safeness.

In an embodiment the high-word memory, and optionally also the further high-word memory comprises a header. The header may comprise a fixed pattern or a checksum of the high-word counting state. This allows detection of tearing, i.e., unexpected power loss.

To find the next memory cell to program or erase, the increment logic may be configured to perform a binary search to find the next cell. Preferably, a binary search with two pointers is used.

Even though the counter is non-volatile, its efficiency may be improved by using some volatile memory. For example, the counter may comprise an index memory which is volatile. The index memory stores an index pointing to the memory cell in the sequence of memory cells representing the next cell. The increment logic is configured to increment the index memory upon performing an increment. The index is initialized at start up, for example, by a binary or linearly search through the sequence. In an embodiment the index memory comprises a further index pointing the active sequence of the multiple sequences. The index memory may be implemented as a register, as SRAM, and the like. To be clear, the index memory is not needed to obtain a working implementation, since all information needed to update the counting state is contained in the non-volatile memory, i.e., in the sequence(s) and high-word. However, keeping track in fast volatile memory of the position where the next update is to take place improves the running time of an update. The index memory may be updated at power-up of the counter, or at some other point before the counter's first increment after power-up.

Memory needed for the counter, e.g. the multiple sequences and/or high-word memory may be implemented in EEPROM.

The counter is an electronic device, e.g. a portable electronic device, and may be used as part of a portable mobile electronic device, such as a mobile phone. The counter may be used as part of a secure non-decreasing counter, by applying countermeasures which shield the counter from unauthorized access; such countermeasures are not further discussed here. The counter may be part of an electronic device such as a set-top box, a computer, a television, etc.

A further aspect of the invention concerns a method for electronic counting wherein at least part of a current counting-state of a counter is represented as a pattern of one and zero states in the memory cells of the sequence of memory cells. The method comprises advancing the pattern of one and zero states of a sequence of memory cells to a next pattern to represent an increment of the counter, alternating between a programming phase in an erasing phase, wherein in the programming phase, programming a next cell of the sequence of non-volatile memory cells from a zero state to a one state, the program phase terminating when all memory cells of the sequence of memory cells are in the one state, and in the erasing phase, erasing a next cell of the sequence of non-volatile memory cells from a one state to a zero state, the erase phase terminating when all memory cells of the sequence of memory cells are in the zero state.

A method according to the invention may be implemented on a computer as a computer implemented method, or in dedicated hardware, or in a combination of both. Executable code for a method according to the invention may be stored on a computer program product. Examples of computer program products include memory devices, optical storage devices, integrated circuits, servers, online software, etc. Preferably, the computer program product comprises non-transitory program code means stored on a computer readable medium for performing a method according to the invention when said program product is executed on a computer For example, on a system comprising a non-volatile memory, say EEPROM, and a processor. The processor may execute software stored in the non-volatile memory, the software controlling a counter of which the counting-state is stored in a different part of the memory as the software. Such a counter may count a variety of things, e.g., number of start-ups, number of cryptographic operation executed, say number of signatures, number of rewrites to a storage system. The applications of counter including secure counters are wide.

In an embodiment, the computer program comprises computer program code means adapted to perform all the steps of a method according to the invention when the computer program is run on a computer. Preferably, the computer program is embodied on a computer readable medium.

BRIEF DESCRIPTION OF THE DRAWINGS

These and other aspects of the invention are apparent from and will be elucidated with reference to the embodiments described hereinafter. In the drawings, FIG. 1 is a block diagram illustrating a counter 100, FIG. 2 is a table illustrating the contents of a sequence of memory cells.

Figure 3:
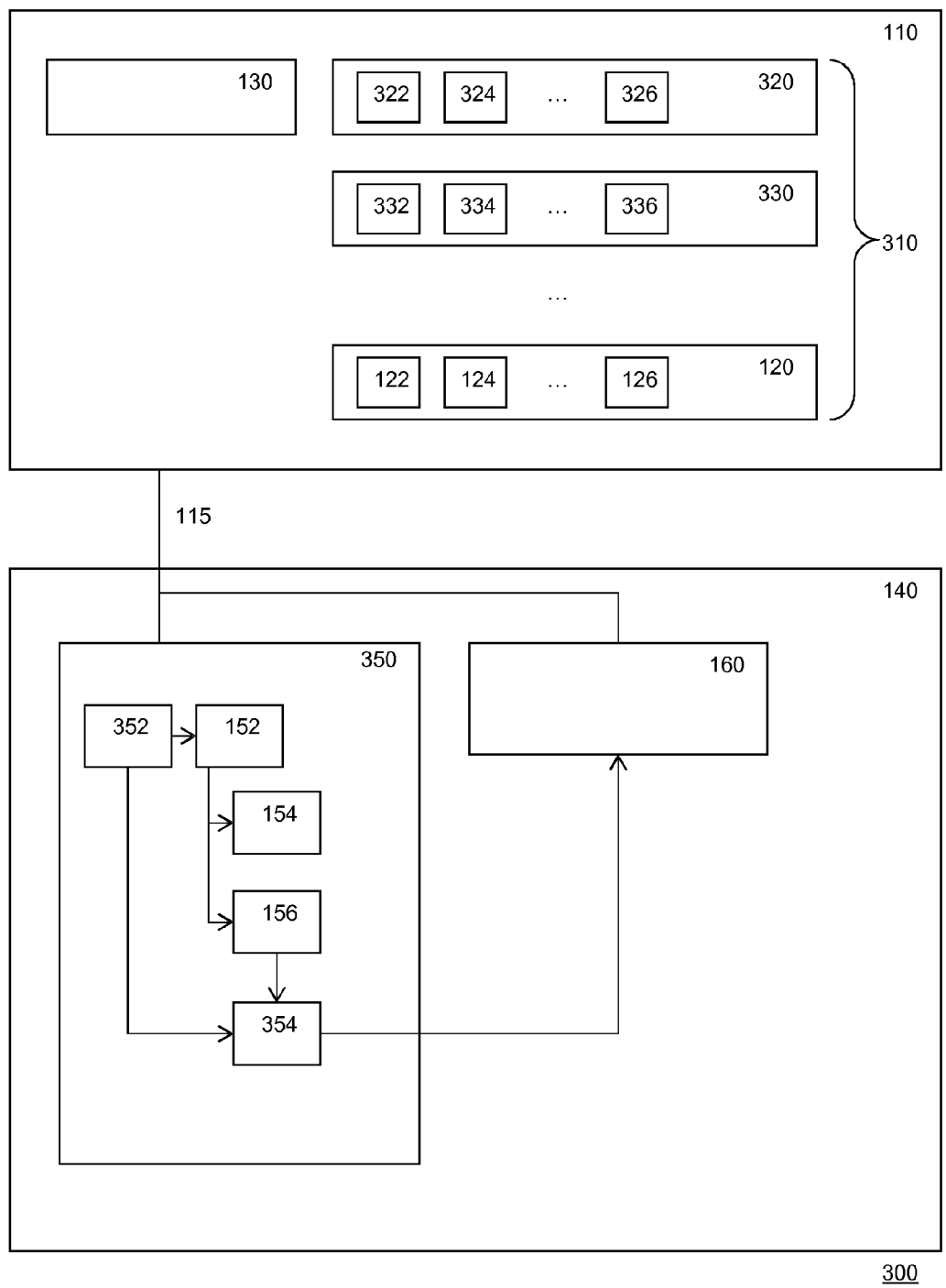
FIG. 3 is a block diagram illustrating a counter 300.

It should be noted that items which have the same reference numbers in different Figures, have the same structural features and the same functions, or are the same signals. Where the function and/or structure of such an item has been explained, there is no necessity for repeated explanation thereof in the detailed description.

DETAILED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

FIG. 1 illustrates a counter 100. Counter 100 comprises a non-volatile memory 110, for example, EEPROM memory, and counter logic 140; Memory 110 and counter logic 140 are connected through a memory interface 115 which allows counter logic 140 to read and write in memory 110.

In one version of counter 100, counter logic 140 is implemented as semiconductor circuit. However, counter logic 140 may also comprise a processor executing software, e.g., stored also in memory 110. Implementation in software may make the counter slower, on the other hand it may decrease the manufacturing cost. If the counter is part of a secure, non-decreasing counter, a circuit implementation is preferred. Hybrid solutions, running some parts on dedicated hardware and some parts in software are also possible. For example, one may implement the sequence of memory cells and the hardware for incrementing it in hardware. Upon an overflow of the sequence of memory cells an interrupt is generated, which causes a software routine to update the high-word. Updating the high-word is relatively rare, so this is advantageous trade off of lower hardware costs for only slight worse run time performance.

Memory 110 comprises a sequence of memory cells 120. Of the sequence three memory cells are shown: 122, 124, 126. The cells may be part of memory words. They are not necessarily individually addressable, i.e. reading one cell may imply reading all other memory cell of the word in which it is comprised. Often the memory interface comprises the same number of data lines as the word width of the memory. Each memory cell has a limited endurance, denoted with 'v'. This means that a cell is designed to be programmed v times and erased v times. Sequence of memory cells 120 is also referred to as the low-word.

Counter logic 140 comprises increment logic configured to advance the counting state of the low word, i.e. of sequence of memory cells 120. The counting state is stored in high-word memory 130 and sequence of memory cells 120. Increment logic 150 may be configured to receive a signal indicating the counter is to be advanced. Counter 100 may be configured to only support increments by 1, however, the counter may be configured to allow larger increments, e.g., by repeatedly advancing by 1. The latter may be optimized.

Technically, the counter could even be configured to support a decrement operation, e.g., by performing the inverse operations of an increment. However, that would cause a problem of endurance since the cells affected by the decrement are written more often than other cells. This means that decrement operations will decrease the upper count limit of the counter. Especially frequent decrement operations would be detrimental.

Increment logic comprises a phase determiner 152. Advancing the counting-state of is done alternately in a series of programming operation and a series of erasing operations, referred to as the programming phase and the erasing phase. Phase determiner 152 determines in which phase the advance will take place.

One may choose to have the programming phase first followed by the erasing phase or the other way round. Indeed, in general, given a counter a valid implementation of counting in a sequence of memory cells 120 may be obtained by inverting all 1's and 0's. We will describe counter 100, taking the programming phase first, followed by the erasing phase, but note that this may be reversed (even on a per sequence basis, if multiple sequences are used).

Increment logic 150 comprises a programming increment logic 154 and an erasing increment logic 156; programming increment logic 154 being used in the programming phase, erasing increment logic 156 being used in the erasing phase, dependent upon the determination of phase determiner 152.

Memory 110 comprises a high-word memory. The high-word memory may also be implemented on a physically different memory. Memory 110 may contain a bit pattern representing a number in base-2 positional notation. To increment high-word memory 130, counter logic 140 comprises a high-word increment logic 160. In an embodiment, high-word increment logic may be implemented as an 'add 1' operation. In a more advanced embodiment, high-word increment logic 160 writes high-word memory 130 in a tearing-safe manner. High-word increment logic 160 is configured to receive a signal from increment logic 150 that the low-word overflowed, in that case, high-word increment logic 160 performs the increment, i.e. add 1 to high-word memory 130, and increment logic 150 establishes sequence of memory cells 120 in a starting pattern.

Use of a high-word is optional even if multiple sequences are used. In that case, sequence of memory cells 120 may be used as a counter, which has a smaller range, but which may be re-used frequently. If high-word memory 130 is omitted, high-word increment logic 160 may also be omitted.

Increment logic 150 is configured to detect an overflow. In this case, the erasing phase is last and overflow is detected when all memory cells in sequence of memory cells 120 are in the zero state again, e.g., by erasing increment logic 156 signaling high-word increment logic 160.

FIG. 2, shows how the content of sequence of memory cells 120 may be updated. In FIG. 2, time goes downwards. The left most bit in each row is the first bit, the right most the final bit. Normally, one will implement the sequence of memory cells, in a natural order in memory 110, say linearly, however, one could choose any permutation.

Initially an initializer (not shown) has erased the content of memory 130 and sequence of memory cells 120, i.e., all memory cells are in the zero state. The counter starts in the programming phase.

As the programming phase 210 progresses increasingly zero cells are programmed to one cells, until at some point all cells are one. At that point the programming phase terminates and the erasing phase starts. As the erasing phase 220 progresses increasingly one cells are programmed to zero cells, until at some point all cells are zero. Note that all states obtained in this manner are different. If 'n' cells are in sequence of memory cells 120, then 2n different states are supported. One may convert the contents in sequence of memory cells 120 to monotonically increasing integers if so desired. Any scheme that assigns the integers from 0 to 2n−1 to the different patterns that occur in the sequence in that order may be used. One way is to assign numbers from 0 to (n−1) to the cells in order from first to final cell. In the programming phase the position of the first zero indicates the integer, in erasing phase the position of the first one plus n indicates the integer. In this manner one counts from 0 to 2n−1. Note that as the counter cycles from that starting position (in this case all 0) to overflow (all zero again for the first time), all cell have been programmed and erased exactly once. For example counter 100 may comprise request logic configured to: receive a request, determine an integer represented by the counting state, and export the determined number in response to the request.

If high-word memory 130 contains a value 'a' and sequence of memory cells 120 may be represented as a value 'b', say as above, then the counter may be represented as value a*(2n)+b. Note that many applications do not require an actual value, only that the content of the counter will not decrease. In such a case it suffices to choose high-word memory 130 and sequence of memory cells 120 large enough, to avoid a pattern from repeating. For example, a secure storage, which whishes to avoid a roll-back attack, or a protocol requiring a nonce to avoid a replay attack may use such a counter.

After the final row of table 200, sequence of memory cells 120 returns again to the all zero state, terminating the erasing phase. At that point the increment logic 150 signals high-word increment logic 160 to increment high-word memory 130.

During operation, counter logic 140 may first receive an initialize signal, and set sequence of memory cells 120 and optionally high-word memory 130 in a starting pattern, in this case all zero, however there are other options, say all one, or high-word memory 130 zero, but sequence of memory cells 120 all one etc.

When increment logic 150 receives an increment signal, typically from a source external to counter 100, phase determiner 152 determines the phase to use. When a single sequence of memory cells 120 is used, phase determiner 152 may determine the phase from the final cell, i.e., from final memory cell 126. If the final value is 0 the phase is programming otherwise it is erasing. This can be seen also from table 200.

Next, phase determiner 152 signals to increment programming increment logic 154 or erasing increment logic 156 depending on the determined phase. If programming increment logic 154 was selected, programming increment logic 154 determines the first cell having a zero value, and programs it. If erasing increment logic 156 was selected, erasing increment logic 156 determines the first cell having a one value, and erases it. Finding the first transition may be done by a linear search through sequence of memory cells 120.

Counter 100 may comprise a transition finder (not shown) comprising a low pointer and a high pointer. The low pointer is initialized to point to the first cell, the high pointer to point to the final cell. If the values in the cells pointed to by the low and high pointers are equal the first cell is to be changed. Otherwise, a cell in between the low and high pointer is selected, preferably, a closest cell to (high pointer+low pointer)/2. If the selected cell is the same as the low pointer, the low pointer is changed to point to the selected cell. If the selected cell is the same as the high pointer, the high pointer is changed to point to the selected cell. The algorithm terminates when the low and high pointer differ by one. At that point the high pointer points to the cell to be changed.

The transition finder may be combined with the phase determiner 152. This is efficient since phase determiner 152 may also requires access to the final cell to determine the phase. Furthermore, if multiple sequences are used the first cell may be used to determine the active sequence, thus further increasing efficiency by combining these steps.

Once the transition has been found, the next different cell or the first cell, is inverted, i.e., the programming increment logic programs a one, the erase increment logic erases the cell. As noted some functionality shared between the programming increment logic and erasing increment logic, e.g. finding the transition, i.e., finding the next cell to be written.

As a further efficiency, especially if multiple increments to the counter are expected between a power-up and power-done of counter 100 or the system in which counter 100 is used, counter logic 140 may comprise a volatile index memory, say in a register or SRAM. The index memory may be used to keep track of the next cell to be changed as part of an increment. The index memory may use a base-2 representation. For example, if sequence of memory cells 120 contains 1024 bits, e.g., a sequence of 64 words of 16 bits each, then 10 bits sufficiency for the index memory, say a 16 bit register or 16 bit of a SRAM.

Erasing increment logic 156 is further configured to determine that the final cell is erased. At that point erasing increment logic 156 generates a signal for high-word increment logic 160 to increment high-word memory 130.

One way to configure counter 100 as a non-repeating counter is as follows. Denote with M a desired maximum of the counter. That is during normal use the counter will not exceed M. Select the number of bits, e.g. memory cells, as ceil(log(v)/log(2)) or higher. If M<v, then sequence of memory cells 120 is not needed. Otherwise, select the number of memory cells in sequence of memory cells 120 as ceil(M/(2*v)) or higher. 'ceil' denotes the ceiling function.

For example, if M=2*10^8, v=10^5, one may take high-word memory 130 as a 17 bit memory, possibly rounded to 32 if 16 bit words are used. For sequence of memory cells 120, a 1000 memory cells (bits) may be used, possibly rounded to 1008 if 16 bit words are used, or more conveniently to 1024 cells (bits). The counter may count at least 2*n*v different counting states (say from number 0 to 2*v*n−1) without violating endurance restriction.

In spite of the efficient increment logic, and the low hardware costs of the counter, it is remarkably close to optimal. Consider 'm' memory cells each having an endurance of v. Increment of a counting state stored in the m cells requires that at least one cell is programmed or erased at each increment. Since in total only 2mv changes are possible, this means that the theoretical maximum number of different patterns that may be used for counting with m cells is 2mv, e.g., from one may count from 1 to 2mv. With a counter design having a log(v)/log(2) bit high-word and m−log(v)/log(2) bits in a sequence of memory cells, one may count up to v*2*(m−log(v)/log(2)), i.e., 2vm−C_v. Or in words, this counter supports the same range minus a constant that depends only on v. As n goes to infinity, the ratio between the theoretical maximum and the attained maximum approaches 1 arbitrarily close.

FIG. 3 is a block diagram illustrating a more complicated counter 300. Counter 300 has the same basis design as counter 100, except that counter 300 uses multiple sequences 310 of bits and a high-word to represent the counting state, and the logic to support that change. Three sequences are shown: sequence of memory cells 120 and two more sequences, sequences 320 and 330. Two sequences or more than 3 are also possible. The multiple sequences may be stored in memory 110. One may use a serial memory access (read/write) where chunks of, e.g., 16-bit or 32-bit can programmed/erased.

Counter 300 progresses through the sequences while counting, at each point one sequence is active and all other sequences are inactive. Once a sequence turns from active to inactive a next sequence is active. When the last sequence goes inactive, the multiple sequences of memory cells 310 overflows, the high-word is incremented and the first sequence will be active again.

An increment is processed by counter 300 by first determining the sequence which is active. One way to determine this is designate one particular pattern in a sequence of memory cells as the inactive pattern. For example, the all zero, or the all one pattern may be used for it. A particular efficient way to identify the active stream is to use the all zero pattern as inactive, and to advance the stream first with a programming phase followed with an erase phase. This has the advantage that at the end of the erase phase, the sequence automatically ends in the inactive pattern. Similarly, one may have the all one pattern as inactive pattern, start with the erase phase and end with a programming phase. The choice need not be the same for all sequences. For simplicity we will assume the all zero pattern is the inactive pattern.

Counter logic 140 comprises increment logic 350 similar to increment logic 150 but with additional logic: an active sequence determiner 352 and overflow logic 354. Active sequence determiner 352 is configured to determine the sequence of multiple sequences of memory cells 310 which does not contain the inactive pattern. There should be precisely one. The information is forwarded to phase determiner 152, which advances the determined sequence as in counter 100. However, when erasing increment logic 156 determines the end of the erasing phase, a signal is forwarded to overflow logic 354 instead of directly to high-word increment logic 160. Overflow logic 354 performs two tasks. First the next sequence of the multiple sequences is changed from inactive to active. For example, if the inactive pattern is all zero, one may program a one state to the first cell of the next cell; this ensures that precisely one sequence is active. If the current sequence was the last sequence, then the first sequence is made active, but also a signal is generated to instruct high-word increment logic 160 to advance high-word memory 130.

Counter 300 may also contain an initializer (not shown). The initializer may set high-word memory 130 to zero. The initializer writes to each sequence its inactive pattern, e.g., all zero, and writes to the first sequence, the first active pattern, e.g., all zero except for the first cell.

Figure 4:
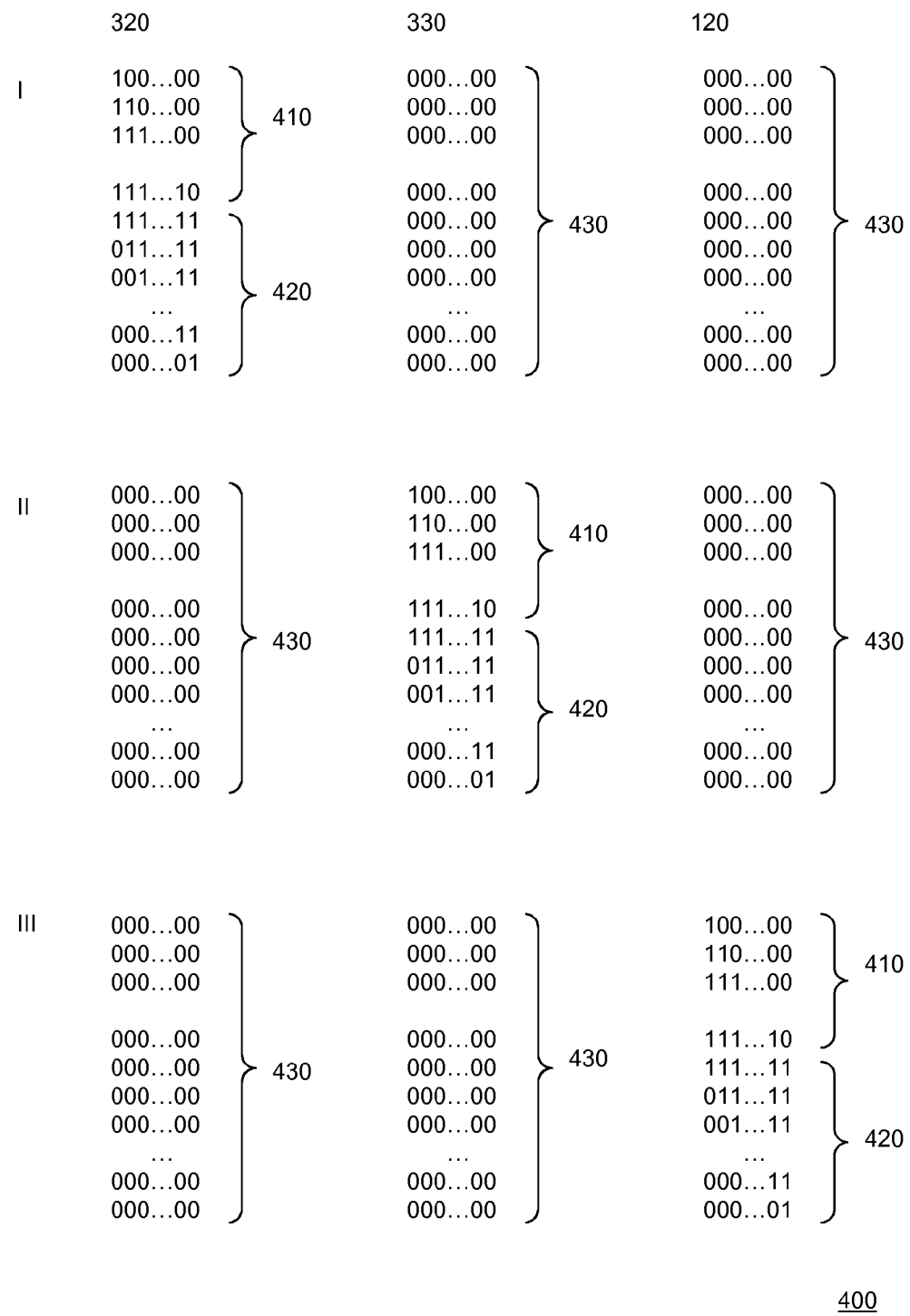
FIG. 4 is a table illustrating the contents of multiple sequences of memory cells.

FIG. 4 show table 400 which illustrates the content of sequences 320, 330 and 120. Time flows downward, at the left are first cells at the right are final cells. The first row is immediately after initialization. The all zero pattern is used to indicate non-active sequences. Advancing uses first a programming phase then an erasing phase. Other choices are possible. Each row corresponds with an increment of the counter.

Table 400 is divided in three sections: in the section marked I, sequence of memory cells 320 is the active sequence, in the section marked II, sequence of memory cells 330 is active, and in the section marked III, sequence of memory cells 120 is active. In section I, one can see that only sequence of memory cells 320 advances, first through a programming phase 410 then through an erasing phase 420. At the end of erasing phase 420 of section I, the inactive pattern is written to sequence of memory cells 320 but also sequence of memory cells 330 is moved to an active pattern, in this case by advancing sequence of memory cells 330. Note this could be done by the programming increment logic. Only when the sequence that is active is move from one sequence to the next, do two cells change. Interestingly, if memory 110 is dual port memory, these updates may be done simultaneously.

In section II only sequence of memory cells 330 is updated, again first through a programming phase 410, then through an erasing phase, in this case sequence 120. In the mean time sequence of memory cells 320 and sequence of memory cells 120 are inactive 430. At the end of the erasing, the next sequence is made active.

At some point the final sequence terminates the erasing phase. That point is found by overflow logic 354, who will then advance high-word memory 130. Note that high-word memory 130 does not advance at the end of section I and II.

Note that active sequence determiner 352 may determine if a sequence is active from the first and final cell only. If the inactive pattern is all 0 or all 1, then the sequence is inactive if the first and final states are both 0 or 1, respectively. Interestingly, for the active sequence the type of operation to be performed next may be determined from the final cell, according to the following table (assume inactive pattern is all 0):

| First cell | Final cell | State |
|---|---|---|
| Zero | Zero | Inactive |
| One | Zero | Active, Program phase |
| Zero | One | Active, Erase phase |
| One | One | Active, Erase phase |

This implies that active sequence determiner 352 and phase determiner 152 may share some implementation, and data, e.g., retrieving of the value of the final cell.

Counters 100 and 300 are for a large part tearing safe. Updating of sequence of memory cells 120 in counter 100 is already tearing safe, since only one operation is performed. Updating of multiple sequences of memory cells 310 in table 200 is tearing safe as long when the active sequence is transferred, the next sequence is changed to active before the current sequence is changed to non-active. For example, in the system denoted above, overflow logic 354 performs the programming operation before the erase operation. Both counters may be improved by adding a tearing safe implementation of the high-word.

In order to have a tearing safe implementation one possibility is to realize an additional further high-word memory, possibly in memory 110. Thus, one has two high-word memories HW1 and HW2 (not shown) that can each be written in one operation, say two 32 bit numbers. One of the two high-word memories has always the current value in it and the other one is used to write the new value. In case of a successful operation the new value is then the most recent one. If less bits are needed than are present in the high-word memories. Say for an endurance of 100 k, only 17 bits are needed, but 32 bits are present in the high-word memory, a special pattern may be written in a number of bits not used for the counting state, say the (e.g. five) most significant bits. The special pattern indicates that the counter value has a valid content. Alternatively, one may write a checksum, say a CRC-8 value of the counting state stored in the high-word. The remaining bits of the words could be used differently if required or kept 0, or ignored.

If both counters have a valid header their content should differ by one, this is always true as the higher counter of both is incremented by one and written to the other one. For example, an initialize may initialize the HW1 to 0 and HW2 to −1, or if negative numbers are to be avoided to HW1 is 1, and HW2 is 0. In the latter case, the value of the high-word should be subtracted by 1. A more sophisticated Gray code could be used for the high-word counter but it is not necessary to achieve, a high counting maximum, say of 200 million cycles.

Below a detailed procedure for High-Word Counter Update is given:
1) Define the currently valid high-word counter state of the two 32-bit words by checking the header values and finding out which one is the higher one.
   a) If header (HW1)=valid && header (HW2)=valid && HW1==HW2+1
      i) PTR=2
2) If header (HW1)=valid && header (HW2)=valid && HW1+1==HW2
   a) PTR=1
3) If LW-overflow & PTR==1
   a) HW1<=HW2+1 (EEPROM write)
   b) Check written value and header, report status
4) If LW-overflow & PTR==2
   a) HW2<=HW1+1 (EEPROM write)
   b) Check written value and header, report status The multiple sequences, of which sequences 320, 330 and 120 are shown, may be stored in memory 110 as follows. The first bits of each one of the multiple sequences are stored in a first word. The second bits of each one of the multiple sequences are stored in a second word. Bit number 'i' of each one of the multiple sequences are stored in word number 'i'. Preferably the number of sequences is less than or equal to the number of bits in a word, most preferably equal. However, in case there are more sequences that bits in a word one may combine multiple words together, e.g. a so-called double word. In an embodiment, each programming operation of the multiple sequences which does not change the active sequence changes an all-zero word to a word having only one one. Each erase operation of the multiple sequences which does not change the active sequence changes a word with one one to the all zero sequence. This implementation keeps the program/erase operations low even though the memory is not bit individually addressable.

Figure 5:
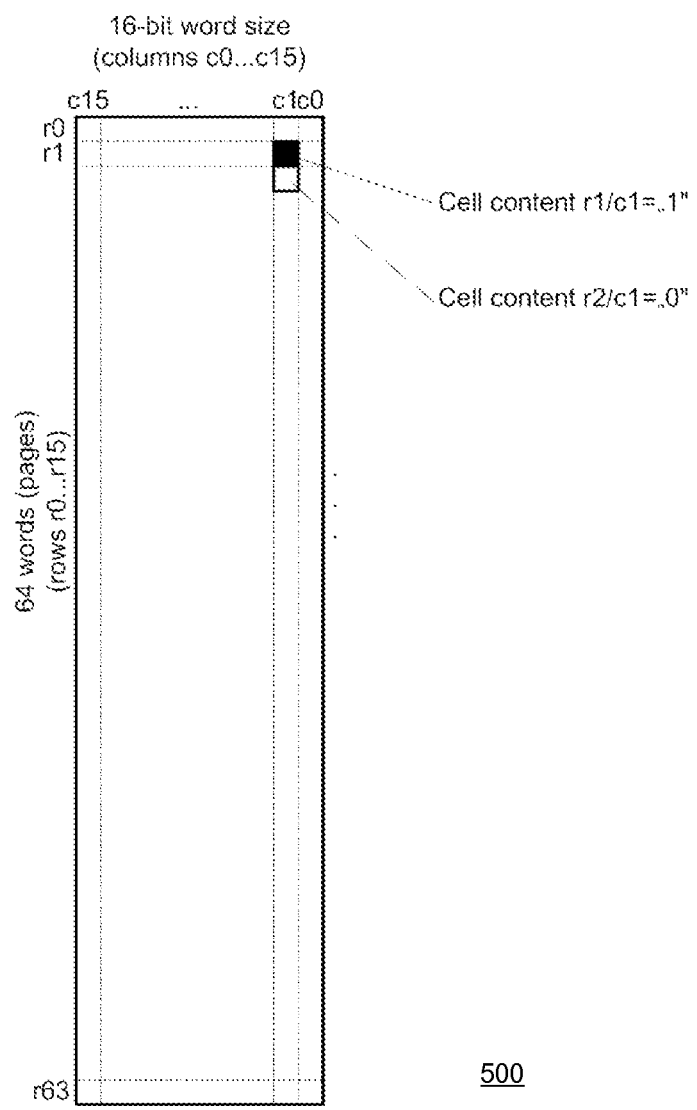
FIG. 5 is a table illustrating a memory architecture supporting multiple sequences of memory cells.

FIG. 5 shows a memory map 500, which is one way to store multiple sequences of memory cells 310. In FIG. 500, 16 sequences of 64 memory cells each are stored in a memory which is organized in 16 bits words. The memory may be EEPROM memory having 16 bits is the word size. The memory may have a limited endurance, say of 100 k.

Multiple sequences of memory cells 310 is stored in a matrix of 64×16 bits whereby the memory and the 16 bits will be denoted as columns (col0 (LSB) until col15 (MSB), also c0 . . . c15). The 64 words (pages) will be denoted as rows (row0 until row63, also r0 . . . r63). A procedure for counting in memory map 500 is given below:
1) Initial state: the 64×16-bit array is initialized such that c0/r0 cell is "1". This is equal to the counter state 0 (given that also the high-word (HW) is zero)
2) With write-only operations all subsequent rows of col0 are programmed (filled up with "1"s until the whole column has "1"). This state represents the counter value 63.
3) Then we start with an erase-only operation of the first row0 (still column 0). This is then represents a counter value 64.
4) Subsequently, the whole column0 is erased until we reach the counter value 126 where only c0/r63 has a "1".
    Note: until now we have cycled (program+erase) the whole column 0 (64 memory cell) and reached the counter value 126.
5) Now, we go from column0 to column1 and start there by writing a "1" to row0 and additionally erase the remaining "1" from column0. The counter value is now 127. (Program before erase allows to have a tearing-safe implementation).
6) The same procedure as before continues for the whole column1 until the counter value 253 is reached.
    Note: until now we have cycled (program+erase) the whole column0 and column1 (128 memory cells) and reached the counter value 253.
7) The same procedure continues for all columns until we reached the counter value 2031 where the "1" is only in c15/r63.
    Note: all 64×16 (1024) bits are now cycled (program+erase) once.
8) This is now an overflow and causes the high-word to be incremented (this procedure is described in more detail in the next sections). The final step is to program c0/r0 to get to the low word counter value 0 again, and erase the cell c15/r63.

A procedure for decoding the Current Counter Value in multiple sequences of memory cells 310 if desired is given below:

The task for decoding the current counter value of the low word, which is always between 0 and 2031, works as follows to minimize the read accesses (whereby a read access to the memory is much faster as writing/erasing the memory). The main task is to find the row address within a column where there is either a "1"→"0" transition or a "0"→"1" transition. This is then related to the current counter. The search algorithm could be like the following:
1) Find the column which has a "1" in row0 and/or in row63 (this takes at the maximum 32 cycles)→this column X indicates the counter offset by X*127
2) Use a binary search algorithm within the column to find the row Y which has a transition and depending whether it is a "1"→"0" (A=0) or a "0"→"1" (A=1) transition add to the resulting counter value: Y+A*63. (Note: if the column is full of "1" the value y=63 and a=0)

The low word counter value equals: LW=X*127+Y+A*63

Typically there is either a write-only OR an erase-only operation executed. If one column is finished a two operations (erase of the last bit of the old column) has to be executed. The counter is also increasing even if a write operation fails due to some issue like immediate power loss. The presented concept has an automated tearing-safe implementation if during change of columns the "1" value is written before erasing the "1" in the last row of the previous column because in all other cases only one single cell is written at a time.

Interestingly, by choosing the number of lines, i.e., the number of multiple sequences, to be a power of two plus 1, in this case 65 in total, simplifies computation considerably, since the required multiplication are then by powers of two, which can be implemented with shifts instead of with a multiplier.

It is noted that other ways to manage multiple sequences are possible.

Figure 6:
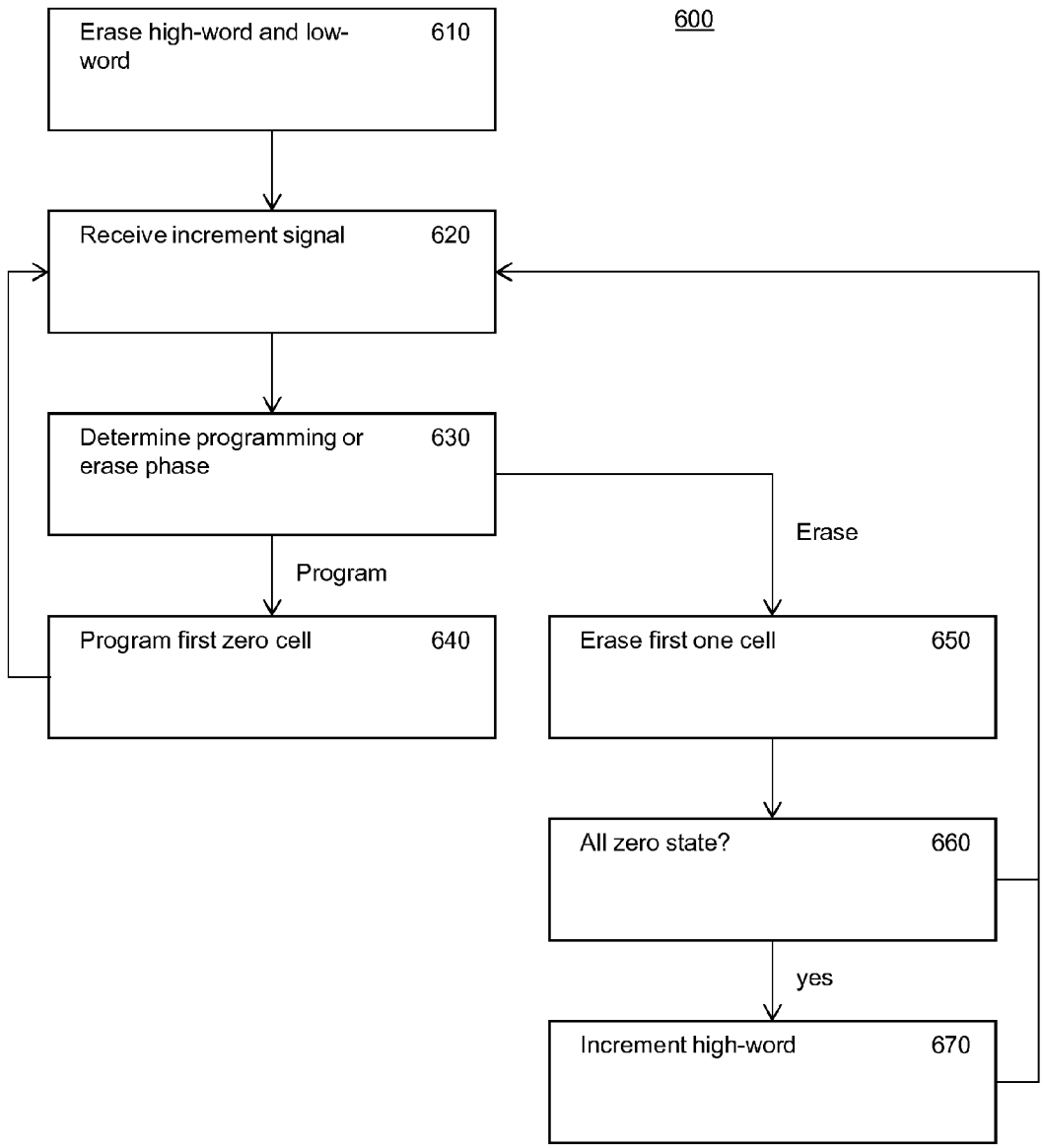
FIG. 6 shows a flow chart for a method 600 of counting.

FIG. 6 shows a flow chart for a method 600 of counting. The shown method may be executed on system like counter 100. The method may be extended to multiple sequences, tear safe improvements, etc, as shown above.

In a step 610, a high-word, e.g., high-word memory 130, and a low-word, e.g., sequence of memory cells 120 are initialized, in this case erased. In a step 620, the method waits to receive an increment signal. When the signal is received, in a step 630 the programming or erase phase is determined. This may be obtained from a volatile memory, or may be determined from the low-word memory itself, e.g., from the final cell. If the phase is programming, then in step 630 the first cell in a zero state is programmed. Such a cell is sure to exist. If such a cell does not exist an error occurred, and an appropriate error recovery may be started. In case of an erasing phase, then in step 650 the first one cell is erased. If the erase resulted in an all zero pattern in the low-word memory then the high-word is incremented in step 670. In both branches the method may return to step 620 to wait for the next signal.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. Moreover, a given step may not have finished completely before a next step is started.

A method according to the invention may be executed using software, which comprises instructions for causing a processor system to perform method 600. Software may only include those steps taken by a particular sub-entity of the system. The software may be stored in a suitable storage medium, such as a hard disk, a floppy, a memory etc. The software may be sent as a signal along a wire, or wireless, or using a data network, e.g., the Internet. The software may be made available for download and/or for remote usage on a server.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. An embodiment relating to a computer program product comprises computer executable instructions corresponding to each of the processing steps of at least one of the methods set forth. These instructions may be subdivided into sub-routines and/or be stored in one or more files that may be linked statically or dynamically. Another embodiment relating to a computer program product comprises computer executable instructions corresponding to each of the means of at least one of the systems and/or products set forth.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or an preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An electronic counter comprising
multiple sequences of memory cells, each memory cell of the multiple sequences being non-volatile and supporting a one state and a zero state, the counter being configured to represent multiple sub-states of a current counting state of the counter as a pattern of one and zero states in the memory cells of the multiple sequences of memory cells,
wherein all-but one of the multiple sequences are configured with a pattern indicating that the sequence is inactive, one of the multiple sequences is configured with a different pattern than the pattern indicating that the sequence is inactive, the pattern being all one states or all zero states, the counter comprising
increment logic configured to
determine an active sequence of the multiple sequences not storing the inactive pattern, and configured to advance the active sequence to a next pattern, upon the next pattern reaching the inactive pattern, the increment logic further advances a next sequence of the multiple sequences, wherein the
increment logic is configured to advance the pattern of one and zero states to a next pattern to represent an increment of the counter, the increment logic comprising programming increment logic and erasing increment logic, the increment logic being configured to alternate between a programming phase in which the programming increment logic advances the pattern, and an erasing phase in which the erasing increment logic advances the pattern, wherein
the programming increment logic is configured to program a cell of the sequence of non-volatile memory cells from a zero state to a one state, the program phase terminating when all memory cells of the sequence of memory cells are in the one state,
the erasing increment logic is configured to erase a cell of the sequence of non-volatile memory cells from a one state to a zero state, the erase phase terminating when all memory cells of the sequence of memory cells are in the zero state;
a non-volatile high-word memory, the counter being configured to represent a further part of the counting-state of the counter in the high-word memory,
a high-word increment logic for advancing the part of the counting-state represented in the high-word memory, the counter being configured for the high-word increment logic to perform the incrementing upon overflow of the sequence of memory cell, determined by
the program phase terminating, or
the erasing phase terminating;
a further non-volatile high-word memory, wherein the high-word increment logic is configured to
determine which memory of the high-word memory and the further high-word memory stores the higher number, and which stores the lower number,
incrementing the higher number, and
writing the incremented higher number to the memory that stores the lower number.

2. A counter as in claim 1, wherein
the non-volatile high-word memory represents a base-2 positional number, and wherein the high-word increment logic is configured to increment the further memory according to a base-2 positional number system, or
the non-volatile high-word memory represents a bit-pattern in Gray encoding, and wherein the high-word increment logic is configured to advance the bit-pattern to the next bit-pattern according to the Gray encoding.

3. A counter as in claim 1, wherein the increment logic is configured to determine a current phase from the state of a final memory cell in the sequence of memory cells, wherein
the current phase is the programming phase if the final memory cell is in a zero state, and
the current phase is the erasing phase if the final memory cell is in a one state.

4. A counter as in claim 1, wherein the increment logic is configured to perform a binary search to find the next cell.

5. A counter as in claim 1, comprising a volatile index memory, for storing an index pointing to a memory cell in the sequence of memory cells representing the next cell, the increment logic being configured to increment the index memory upon performing an increment.

6. A counter as in claim 1, wherein the memory cells are memory cells in a larger non-volatile memory, the larger memory being organized in multiple memory words, wherein multiple final memory cells of the multiple sequences of memory cells lie in the same memory words.

7. A counter in claim 6, wherein the number of bits in a memory word equals the number of sequences in the multiple sequences.

8. A counter as in claim 1 wherein the memory cells in the sequence of memory cells are EEPROM memory cells, and optionally wherein the high-word memory is EEPROM memory, and optionally wherein all memory cells of multiple sequences of memory cells are EEPROM memory cells.

9. An electronic device comprising the counter as claimed in claim 1.

10. A counter as in claim 1, wherein
the programming increment logic is configured to determine the first cell of the sequence of non-volatile memory cells having a zero value, and program the first cell from a zero state to a one state,
the erasing increment logic is configured to determine the first cell of the sequence of non-volatile memory cells having a one value, and program the first cell from a one state to a zero state.

11. A counter as in claim 1, comprising a volatile index memory, for storing an index pointing to a memory cell in the sequence of memory cells representing the next cell, the increment logic being configured to increment the index memory upon performing an increment.

12. An electronic counter comprising:
multiple sequences of memory cells, each memory cell of the multiple sequences being non-volatile and supporting a one state and a zero state, the counter being configured to represent multiple sub-states of a current counting state of the counter as a pattern of one and zero states in the memory cells of the multiple sequences of memory cells,
wherein all-but one of the multiple sequences are configured with a pattern indicating that the sequence is inactive, one of the multiple sequences is configured with a different pattern than the pattern indicating that the sequence is inactive, the pattern being all one states or all zero states, the counter comprising
increment logic configured to
determine an active sequence of the multiple sequences not storing the inactive pattern, and configured to advance the active sequence to a next pattern, upon the next pattern reaching the inactive pattern, the increment logic further advances a next sequence of the multiple sequences, wherein the increment logic is configured to advance the pattern of one and zero states to a next pattern to represent an increment of the counter, the increment logic comprising programming increment logic and erasing increment logic, the increment logic being configured to alternate between a programming phase in which the programming increment logic advances the pattern, and an erasing phase in which the erasing increment logic advances the pattern, wherein the programming increment logic is configured to program a cell of the sequence of non-volatile memory cells from a zero state to a one state, the program phase terminating when all memory cells of the sequence of memory cells are in the one state,
the erasing increment logic is configured to erase a cell of the sequence of non-volatile memory cells from a one state to a zero state, the erase phase terminating when all memory cells of the sequence of memory cells are in the zero state;
wherein the memory cells are memory cells in a larger non-volatile memory, the larger memory being organized in multiple memory words, wherein multiple final memory cells of the multiple sequences of memory cells lie in the same memory words.

13. A counter in claim 12, wherein the number of bits in a memory word equals the number of sequences in the multiple sequences.

14. A counter as in claim 12, comprising
a non-volatile high-word memory, the counter being configured to represent a further part of the counting-state of the counter in the high-word memory,
a high-word increment logic for advancing the part of the counting-state represented in the high-word memory, the counter being configured for the high-word increment logic to perform the incrementing upon overflow of the sequence of memory cell, determined by
the program phase terminating, or
the erasing phase terminating.

15. A counter as in claim 14, wherein
the non-volatile high-word memory represents a base-2 positional number, and wherein the high-word increment logic is configured to increment the further memory according to a base-2 positional number system, or
the non-volatile high-word memory represents a bit-pattern in Gray encoding, and wherein the high-word increment logic is configured to advance the bit-pattern to the next bit-pattern according to the Gray encoding.

16. A counter as in claim 12, wherein the increment logic is configured to determine a current phase from the state of a final memory cell in the sequence of memory cells, wherein
the current phase is the programming phase if the final memory cell is in a zero state, and
the current phase is the erasing phase if the final memory cell is in a one state.

17. A counter as in claim 12, wherein the increment logic is configured to perform a binary search to find the next cell.

18. An electronic device comprising the counter as claimed in claim 12.

* * * * *